Aug. 5, 1969 A. KÜRZL ET AL 3,460,074

FILTER FOR VERY SHORT ELECTROMAGNETIC WAVES

Filed July 20, 1965 4 Sheets-Sheet 1

INVENTORS
ALBERT KÜRZL
JOHANN STEINKAMP
BY ATTORNEYS

Aug. 5, 1969 A. KÜRZL ET AL 3,460,074

FILTER FOR VERY SHORT ELECTROMAGNETIC WAVES

Filed July 20, 1965 4 Sheets-Sheet 2

INVENTORS

ALBERT KÜRZL

JOHANN STEINKAMP

BY Spiegel & Spiegel

ATTORNEYS

Aug. 5, 1969 A. KÜRZL ET AL 3,460,074

FILTER FOR VERY SHORT ELECTROMAGNETIC WAVES

Filed July 20, 1965 4 Sheets-Sheet 3

INVENTORS

ALBERT KÜRZL
JOHANN STEINKAMP

BY Spiel & Spiel

ATTORNEYS

Aug. 5, 1969 A. KÜRZL ET AL 3,460,074

FILTER FOR VERY SHORT ELECTROMAGNETIC WAVES

Filed July 20, 1965 4 Sheets-Sheet 4

INVENTORS

ALBERT KÜRZL

JOHANN STEINKAMP

BY [signature] ATTORNEYS 3,460,074
Patented Aug. 5, 1969

3,460,074

FILTER FOR VERY SHORT ELECTRO-MAGNETIC WAVES

Albert Kürzl, Munich-Lochhausen, and Johann Steinkamp, Munich Germany, assignors to Siemens Aktiengesellschaft, Germany, a corporation of Germany Filed July 20, 1965, Ser. No. 473,279
Claims priority, application Germany, July 21, 1964, S 92,171
Int. Cl. H03j *3/26;* H03h *5/08*
U.S. Cl. 333—73 8 Claims

ABSTRACT OF THE DISCLOSURE

An electrical filter comprising a filter with inductances formed by input leads and capacity formed from a stator which has aligned openings into which tuning plungers are received, is disclosed. A ground plane supports the tuning plungers and in one embodiment the stator is divided along a line of a central aligned opening into which the middle tuning plunger is received to form a $\pi$ type filter. In a second embodiment, the stator is divided into three portions on planes through the two end cylindrical openings to form a T-type filter. The filter structure is mounted in a shielding casing.

The invention relates to a filter for very short electromagnetic waves with a wavelength of a few decimeters and less, especially for the frequency range of the centimeter waves.

Filters for electric waves are constructed as a rule, up to the range of the meter waves, in so-called concentrated circuit technique, with concentrated capacitances and coils thus being utilized. Occasionally even in the range up to frequencies of about 500 mc, corresponding to a wavelength of about 60 cm., filter circuits were achieved, but this appeared to constitute a physical limit for filters of this design. As the frequency becomes higher, it becomes more and more difficult, with the usual capacitors and coils, to achieve the extremely small capacitance and inductance values and simultaneously fulfill the requirement of sufficiently high quality of the individual resonance circuits. Even in the range of meters waves the concentrated circuit elements, in accordance with prior opinions with increasing frequency, more and more necessitated elements with conductor characteristics, associated with corresponding reflection properties. For frequencies above several 100 mc., as for example, in the television range, bands IV and V, accordingly, only filters of conduction elements are utilized, in which the transformation properties of conduction sections are utilized for the formation of required reactances, possibly in conjunction with small metal slugs for the formation of capacitances. These filters do, to be sure, fulfill relatively well the demands to be made with respect to the circuit qualities, but they have the serious drawback of relatively high mechanical expenditure, combined with the electrical property, troublesome as a rule, of periodically repeating pass and blocking ranges. The latter is based upon the conduction properties of the reactance elements employed.

According to the teaching of the invention, it is possible to avoid the technical difficulties above mentioned and if this happens to be essential, also the electrical difficulties of periodically repeating pass and blocking ranges, in a filter for very short electromagnetic waves with a wavelength of several decimeters and less, even if in this wavelength, area the concentrated circuit technique is utilized, and more particularly in such a way that the basic filter circuit has the form of a T or $\pi$ member, in which cross capacitances are provided in all transverse branches and in which the inductances are constructed as concentrated inductances in the form of small coils or short conductor elements.

In the following, the invention is explained in detail with the aid of the drawings, in which:

FIG. 1*a* illustrates, in schematic form a filter embodying the invention;

FIG. 1*b* is an equivalent circuit diagram of the filter illustrated in FIG. 1*a*;

FIG. 2*a* illustrates a modified form of a portion of the filter illustrated in FIG. 1*a*;

FIG. 2*b* is an equivalent circuit diagram of the filter structure illustrated in FIG. 2*a*;

FIGS. 7*a* through *i* illustrate equivalent circuit diagrams of filters to which the invention is particularly adapted.

Figure 1A:
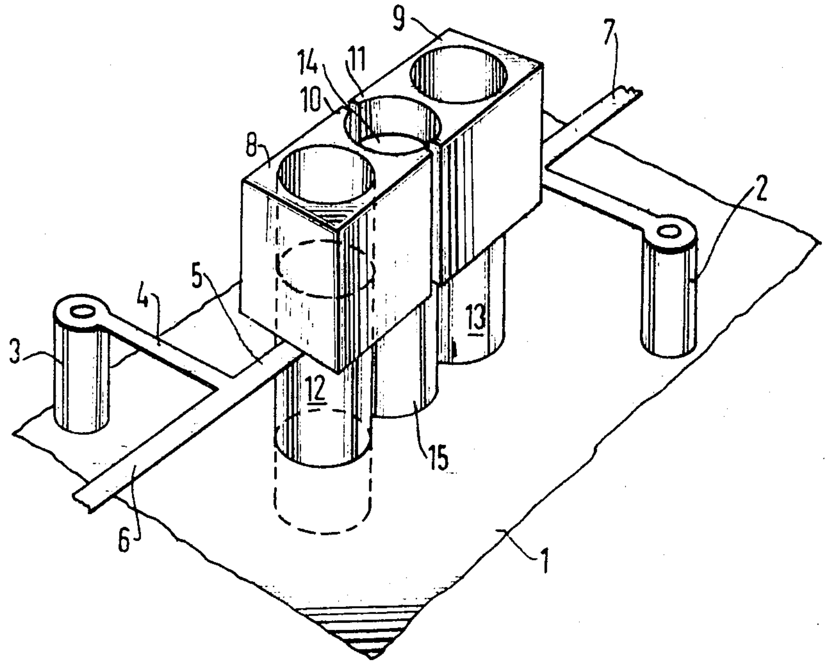

FIG. 1*a* illustrates an equivalent circuit diagram of a capacitatively coupled band filter with two parallel resonance circuits. It is assumed that the requirement exists both for separate tunability of the parallel resonance circuits and also adjustment of the capacitative coupling. According to the teaching of the invention this is achieved, as shown in FIG. 1*a*, by the use of a metal base plate 1, on which is rigidly mounted, by means of two metal supports 2, 3, a conductor system, for example, which is in the form of two T-shaped, stable metal strips, which may be stamped out of suitably thick sheet metal, or otherwise suitably formed. Of this metal strip, the parts 4, 5 form the inductance of the parallel resonance circuit represented at the left in the equivalent circuit diagram, and the corresponding conductor sections, which are carried by the support 2, form the inductance of the parallel resonance circuit represented at the right in the equivalent circuit diagram. The conductor parts 6, 7 are elevated terminals lying on ground (plate 1) of the band filter. The two cross capacitances are formed by two plunger or piston type capacitors, whose stators 8, 9 are respectively carried by the conductor part 5 and the covered corresponding conductor part of the right-hand conductor section. The stators 8 and 9 have projecting portions 10 and 11 in the form of cylindrical half-shells. Into the bores of the stators 8, 9 are disposed, in conductive connection with the base plate 1, screw plungers or pistons 12 and 13, which form the rotors of these cross capacitors. The plungers 12, 13 consist preferably of metal and are air-insulated with respect to the stators 8, 9. It is also possible to provide a thin di-electric interlayer, for example, of polystyrene or polytetrafluorethylene, in order to assure an exact guidance of the screw plungers within the bores of the two stators. The capacitance of the coupling capacitor lying in the longitudinal branch of the equivalent circuit diagram with the stators 10, 11, is adjustable by a small metal plunger 14 variable as to insertion depth. This capacitance plunger 14 is supported on a screw member 15 of insulating material and is variable by the distance of such screw member 15 in its inserted depth between the half shells 10, 11.

Figure 1B:
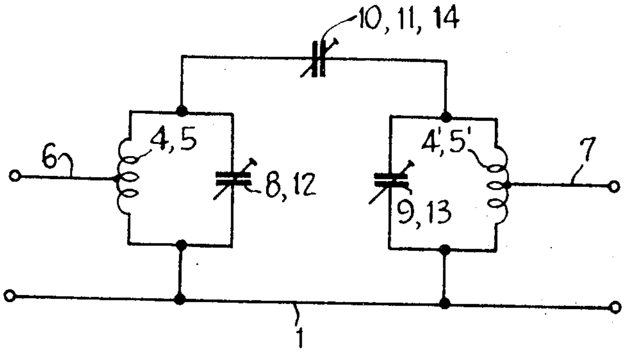

The filter shown in FIG. 1 is, for example, turned for a frequency of 1 to 2 gc., in which connection care should be taken that the conductor sections 4, 5 of the input circuit and the corresponding conductor sections of the output circuit form the inductance, can be kept so short that they assume conduction characteristics only with considerably higher frequencies, and, therefore, in the frequency range here under discussion still act practically as concentrated inductances.

Figure 2A:
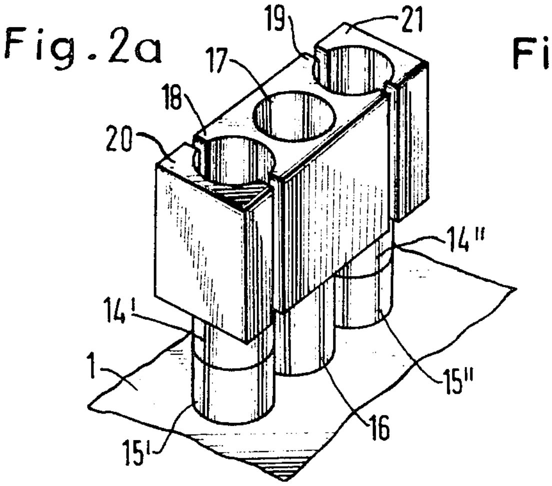
Figure 2B:
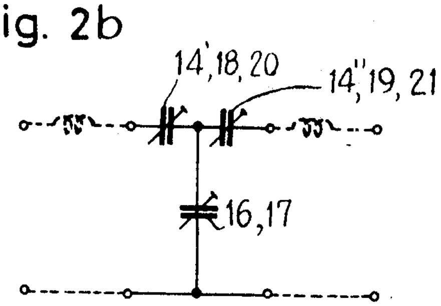

In the type of filter illustrated in FIG. 1*a*, the equivalent circuit diagram has the form of a $\pi$ member with two cross capacitances and a longitudinal capacitance. The concentrated circuit technique is, however, also utilizable if in the equivalent circuit diagram the capacitances do not have the form of a $\pi$ but that of a T. This embodiment is illustrated in FIG. 2*a*, in which the base plate 1 is only partially represented. Further, for the sake of clarity, the conductor parts forming corresponding inductances, which parts carry the various stators, are also omitted. It will be noted from FIG. 2, the middle portion is constructed as a cross capacitor with a stator part 17 and a rotor part 16, the latter preferably again comprising a metal plunger, and 17 being a metal part with a corresponding bore, in which plunger 16 is inserted with the maintenance of a tubular shaped space therebetween. The stator 17 carries two projecting portions in the form of cylindrical half-shells 18, 19, to each of which there is allocated respective cylindrical half-shells 20 and 21. Disposed in the bores formed by the respective pairs of half-shells 18, 21 and 19, 21, as in the longitudinal capacitor of the example of FIG. 1, are plungers 14′, 14″, which are carried by insulating screw members or plungers 15′, 15″. It is possible, accordingly to achieve the T-circuit of a filter base member. For example, as indicated in broken lines in the equivalent circuit diagram, to each of the longitudinal capacitances there can be allocated a coil or concentrated inductance.

If in the individual case it is essential that external radiation on the filter be effectively prevented or if the operating wavelength is so short (especially in the case of wavelengths of only a few centimeters) that the filter begins to show certain reflection properties which interferes with other devices, the use of a shield casing is then recommended which encloses the filter basic unit or, possibly, several shield members, high-frequency tight and whose selected dimensions are so small that they are still small as compared to a half wavelength at frequencies for which the filter is to operate according to its equivalent circuit diagram. If, in the individual case, despite this choice of dimensioning of the casing, there still occur troublesome internal casing resonances, which for example, involve the development of troublesome types of oscillation or in the range of considerably higher frequencies, it is then possible, in a manner known per se, by the use of wave-absorbing material, such as graphite or a ferrite, employing such dimensions and manner of application in the shielding casing as are known per se, whereby it is effective only for the interfering resonances but not for the various operating frequencies.

Figure 3:
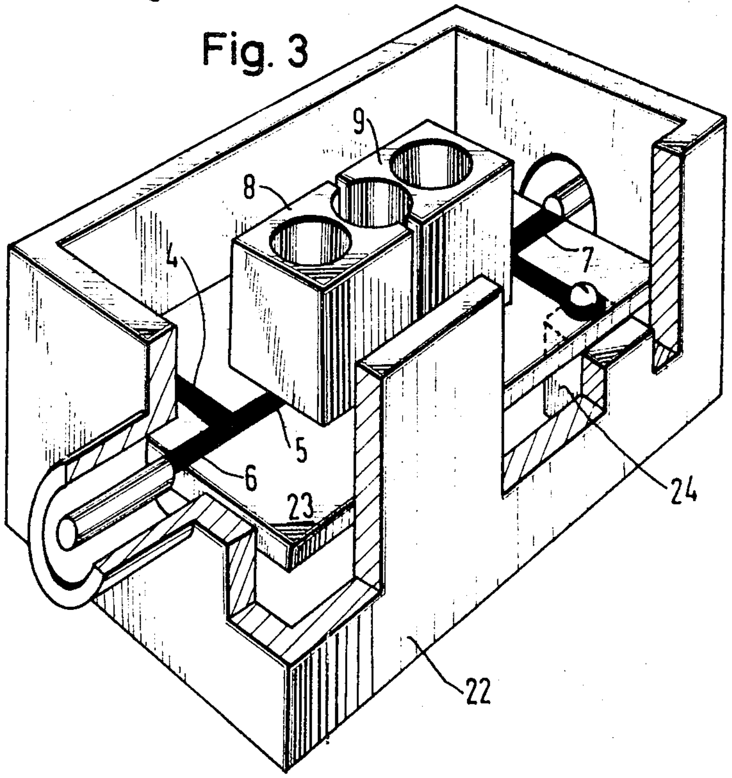
FIG. 3 illustrates a modified construction similar to that of FIG. 1*a*, embodying a shield structure.

In this context, however, it should be noted that in many cases it is sufficient to merely close the shielding container high-frequency tight in only one circumferential direction or except for one side, as such concentration of the electric field achieves a sufficient shielding. An example of the last-mentioned arrangement is illustrated in FIG. 3. In a box-like shield casing 22, which for clarity is broken away in a number of places (indicated by the hatching), there is inserted a carrier plate 23 of dielectric material, for example, polystyrene. Preferably this insertion is accomplished by mounting the carrier plate 23, by means of screws on projections 24 in the interior of the casing. Instead of projections there may also be provided corresponding grooves or the like in the inner wall of the casing. It is also possible to construct the casing in two parts which are separable in the plane of the carrier plate and to support the carrier plate at least partially within this separating joint. The carrier plate 23 of dielectric material carries, in turn, the conductor sections 4, 5 corresponding to the construction of FIG. 1*a* and the connection lines 6, 7. Further, the carrier plate 23 has in the zone of parts 8, 9 a metallizing corresponding in configuration to their contact surface, to which the parts 8 and 9 are soldered. In this manner there also is assured a rigid anchoring of parts 8 and 9 on the carrier plate 23. The screw plungers 12, 13 according to FIG. 1*a*, for reasons of clarity are not represented in detail. The same holds for the rotor plunger 14 with its supporting screw member 15. It will be noted that in this filter construction from the connection conductors 6, 7 there is effected a direct connection to the inner conductors of two coaxial line terminals whose outer conductors are connected with the wall of casing 22. It also is worth mentioning that the ground connection of the cross inductances 4, 5 is accomplished on the input side and, on the corresponding output side by means of the screws connected to the metal portion 24, simultaneously with the function of the retaining screws in maintaining the dielectric carrier plate in mounted position. The example shown in FIG. 3 is readily usable and tunable for a frequency range up to about 10 gc. and into the range of the centimeter waves without the use of a shielding cover. In many cases it even suffices to construct the shielding casing 22 merely in the form of a short tube of rectangular cross section open at both ends, which can then, if necessary, be closed at the ends by additional closure plates. Instead of the transitions to coaxial lines, likewise corresponding transitions to band conductors are usable.

Instead of the inductances formed by elongated conductor parts, there can also be used inductances in the form of regular small coils with a winding diameter of a few millimeters and smaller, which are securely anchored on corresponding supporting points, such as surfaces suited for a soldering and the like. This constructional form for the inductances is likewise usable on into the range 10 gc. Filters with such concentrated regular coils have been successfully tested at frequencies of 6 and 8 gHz. The circuit qualities of the individual resonance circuits of such a filter are, surprisingly, relatively high. Values were achieved which lie above 100.

Figure 4:
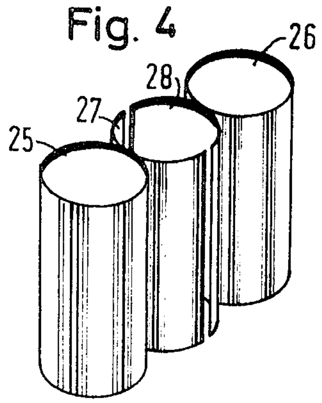
FIG. 4 illustrates a modified form of capacitor stator utilizing a shell or tubular construction.

Instead of the solid stators illustrated in the preceding examples of construction, it is also possible to use correctly designed shell-like or tubular stators, as represented by the example of FIG. 4. There, two stators 25, 26, consisting of a thin-walled tube, are connected by soldering with two half-shell stators 27, 28. The supporting arrangement and other design features of this capacitance $\pi$ member can be effected as explained with the aid of the previous examples.

For the production of the subdivided stators it has proved advantageous if the individual stators are at first made in unitary form, for example, produced in the form of a solid block or of adjacently arrayed tubes which are provided with corresponding bores. Such stator set is then solidly anchored on the corresponding holding device, for example, the carrier plate 23, and by sawing of the corresponding stator sections, the corresponding subdivisions may be subsequently produced. It is thereby possible to assure maintenance of the exact internal form for reception of the cooperable plunger. The bores in the individual stators do not absolutely have to be perfectly cylindrical, but may have a cross-section deviating therefrom. The same holds also for the rotors or plungers, but in this case a separate drive screw or member for each individual rotor is necessary, since the latter no longer can be supported for rotation on its longitudinal axis. In this context, to be sure, it has also been conceived to construct the capacitors, in the form of two parts, one of which extends in a bore of the other, but solely through rotation a capacitance modification in the desired degree occurs. For example, this is attainable by providing in the stator an eccentric surface with respect to which an eccentrically borne rotor is movable.

Figure 5:
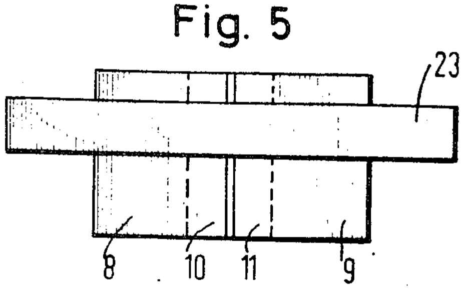
FIG. 5 illustrates a modified form of stator mounting.

While in the example of the construction of the filters heretofore illustrated, the stators are anchored with their one end on the carrier plate 23, in the example according to FIG. 5, the carrier plate 23 of dielectric material is illustrated as engaging the central portions of the stators. This construction has often proved necessary when the constructional height of the whole filter part is subject to certain limitations. In this connection it is also possible to embed the individual stators in a plastic layer sealing all sides, with the exception that there are left free the spaces for the rotor plungers.

Figure 6:
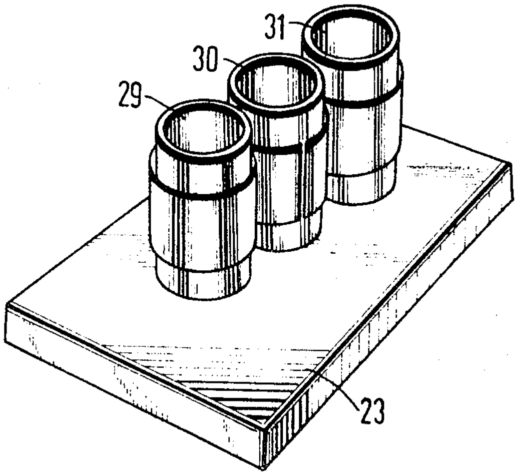
FIG. 6 illustrates a further modification of stator mounting.

Another advantageous form of construction for the stator mounting in a filter according to the invention is illustrated in FIG. 6. There, the carrier plate 23 has three tubular attachments 29, 30, 31 which are secured on the carrier plate 23, for example, by cementing or, as constructed as an injection molding part of plastic, and protrude directly out of the carrier plate 23. It would, moreover, if the tubes 29, 30 and 31 are merely inserted, especially if cemented in, also be possible for the carrier plate 23 to consist of metal. On the tubes 29, 30 and 31 there are, corresponding to FIG. 4, stator-tube parts mounted on and anchored, especially pressed on with press fit and, possibly, additionally anchored by small reinforcing corrugations. Instead of tubes, it is also possible to apply stator parts corresponding to FIGS. 1 and 2. Also this construction of the capacitor part of a filter according to the invention is usable to advantage for filter constructions according to FIGS. 1 to 4.

Figure 7:
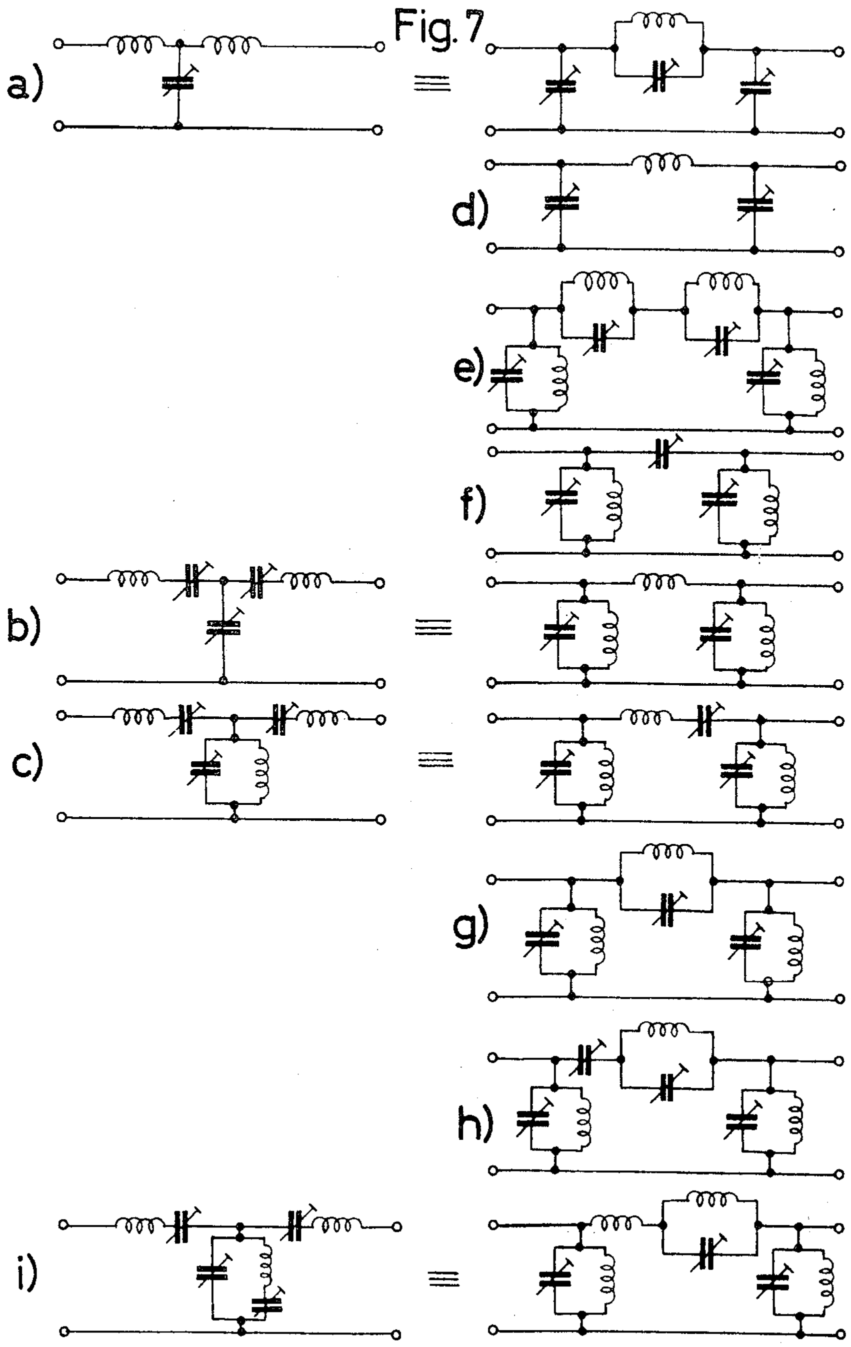

In FIG. 7 there are presented additional equivalent circuit diagrams of basic filter types in which the teaching according to the invention can be readily realized in filters of concentrated construction into the range of centimeter waves. In FIG. 7*a*, a low-pass member is illustrated, while FIGS. 7*b* and 7*c* illustrate band pass types with series resonance circuits in the longitudinal branches. FIGS. 7*b* and 7*c* differ merely in the feature that in FIG. 7*c*, the cross branch also is a resonance circuit, particularly, a parallel resonance circuit. In the left-hand column of FIG. 7, basic filter arrangements in T-circuit are presented, while in the right-hand column of FIG. 7 there is presented a plurality of equivalent circuit diagrams which correspond to the basic form of a $\pi$ member. The basic members corresponding to FIGS. 7*a* and 7 , in $\pi$ circuit are, in each case, represented next to each other. As is apparent, the equivalent circuit diagrams shown in FIGS. 7*d*, *e*, *f*, *g* and *h* cannot without difficulty be realized in a form corresponding to the T-circuits. For these circuits, therefore the $\pi$ circuit is in each case more advantageous, because it makes possible the absorption of stray cross-capacitances in filter capacitances. In the $\pi$ equivalent circuit diagram according to FIG. 7*i*, the possible stray cross-capacitance which occurs between the longitudinal inductance and the parallel resonance circuit lying in the longitudinal branch is also absorbed over the cross branch lying to the right, which has a cross capacitance. In the corresponding T equivalent circuit diagram it is, to be sure, possible to completely avoid any such stray capacitance.

FIGURES 7*a* through 7*i* disclose filters of known types which may be constructed by combining the lumped constant elements of the present invention. For detailed description of the filters shown in FIGURES 7*a* through 7*i* reference may be made to "Radio Engineer's Handbook" by Terman, 1950, pages 197 to 251.

Insofar as T members are present in the equivalent circuit diagrams which end with longitudinal branches there still occur, of course, as viewed from the terminals, certain cross capacitances in the physical realization, but these can be caught in the following filter members or high frequency terminals. It is not absolutely necessary, that complete T or $\pi$ members be provided, but it is possible, just as in the usual filter technique, to allow the filter to be closed off with half-members or to have it consist only of half-members.

Changes may be made within the scope and spirit of the appended claims which define what is believed to be new and desired to have protected by Letters Patent.

In the foregoing description and in the following claims the expression "a plurality of interconnected capacitors" is used. This expression means a Y-section, in the arms of which capacitors are provided.

We claim:

1. A filter comprising, a conductive ground plate, a pair of inductive reactance leads insulatingly supported from said ground plate, a stator structure with opposite ends attached to said leads and formed with three cylindrical openings, said stator divided into a plurality of contiguous parts and having stator walls formed with slits, three tuning plungers supported from said ground plate and receivable into the cylindrical openings of said stator structure and the inductance reactance of the leads and the capacity reactance between the stator and plungers such that a resonant coupled band-pass filter is formed.

2. A filter according to claim 1 wherein said stator is formed into two parts by said slots which are formed through the stator adjacent the central cylindrical opening and series capacitive reactance formed between said two parts and the plunger receiver into the central opening, and parallel capacitive reactance formed between the two end plungers and said stator.

3. A filter according to claim 1 wherein said stator is formed into three parts by said slots formed through the stator adjacent the end openings and series capacitive reactance formed between the end plungers and the stator, and parallel capacitive reactance formed between the plunger received in the central opening and the stator.

4. A filter according to claim 2 wherein the plunger received within the central cylindrical opening is insulated from the ground plate.

5. A filter according to claim 4 wherein the plungers received within the first and third cylindrical openings are electrically connected to said ground plate.

6. A filter according to claim 3 wherein the plungers received in the end cylindrical openings are insulated from said ground plate.

7. A filter according to claim 6 wherein the plunger received in the central opening is electrically connected to the ground plate.

8. A filter according to claim 1 comprising a housing in which said filter structure is mounted.

References Cited

UNITED STATES PATENTS

| | | |
|---|---|---|
| 2,239,905 | 11/1940 | Trevor. |
| 2,201,326 | 5/1940 | Trevor. |
| 2,132,208 | 10/1938 | Dunmore. |
| 2,284,529 | 5/1942 | Mason. |
| 2,513,761 | 7/1950 | Tyson. |
| 2,976,498 | 3/1961 | Locus. |
| 2,820,206 | 1/1958 | Arditi et al. |
| 2,892,163 | 6/1959 | Todd. |

HERMAN KARL SAALBACH, Primary Examiner

C. BARAFF, Assistant Examiner

U.S. Cl. X.R.

333—76, 84